(12) United States Patent
Cheng et al.

(10) Patent No.: US 9,142,572 B1
(45) Date of Patent: Sep. 22, 2015

(54) ARRAY SUBSTRATE

(71) Applicant: AU Optronics Corp., Hsin-Chu (TW)

(72) Inventors: He-Yi Cheng, Hsin-Chu (TW);
Hsin-Chun Huang, Hsin-Chu (TW);
Ching-Sheng Cheng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/595,230

(22) Filed: Jan. 13, 2015

(30) Foreign Application Priority Data

Oct. 27, 2014 (TW) .............................. 103137083 A (51) Int. Cl.
| | |
|---|---|
| *H01L 29/04* | (2006.01) |
| *H01L 31/036* | (2006.01) |
| *H01L 27/15* | (2006.01) |
| *H01L 31/12* | (2006.01) |
| *H01L 33/00* | (2010.01) |
| *H01L 27/12* | (2006.01) |
| *H01L 29/423* | (2006.01) |
| *H01L 29/417* | (2006.01) |
| *H01L 27/146* | (2006.01) |
| *H01L 51/50* | (2006.01) |

(52) U.S. Cl.
CPC .......... *H01L 27/124* (2013.01); *H01L 27/1259* (2013.01); *H01L 27/14609* (2013.01); *H01L 27/14643* (2013.01); *H01L 29/41733* (2013.01); *H01L 29/42356* (2013.01); *H01L 51/50* (2013.01)

(58) Field of Classification Search
CPC ..................... H01L 27/1259; H01L 27/14609; H01L 27/14643; H01L 51/50; H01L 27/124
USPC ........................................................ 257/72, 83
See application file for complete search history.

(56) References Cited

U.S. PATENT DOCUMENTS

| | | | |
|---|---|---|---|
| 7,683,382 B2 | 3/2010 | Jung | |
| 8,253,907 B2 | 8/2012 | Park | |
| 8,558,975 B2 | 10/2013 | Park | |
| 8,907,342 B2 * | 12/2014 | Zhang | ............................ 257/59 |
| 2012/0043558 A1 * | 2/2012 | Lai et al. | ......................... 257/88 |
| 2015/0185513 A1 * | 7/2015 | Wu et al. | ............... H01L 27/124 |

FOREIGN PATENT DOCUMENTS

TW        I396312        5/2013

* cited by examiner

*Primary Examiner* — David S Blum
(74) *Attorney, Agent, or Firm* — Winston Hsu; Scott Margo (57) ABSTRACT

An array substrate includes a plurality of gate lines, first data line segments, second data line segments, first thin film transistors and second thin film transistors. Each first thin film transistor includes a first gate electrode, a first source electrode and a first drain electrode, and each second thin film transistor includes a second gate electrode, a second source electrode and a second drain electrode. The first data line segment, the second data line segment and the next first data line segment arranged sequentially in a first direction define a first gap and a second gap, where the second gap is greater than the first gap. The first source electrode, the second source electrode and the next first source electrode arranged sequentially in the first direction define a third gap and a fourth gap, where the third gap is greater than the first gap, and the fourth gap is smaller than the second gap.

7 Claims, 7 Drawing Sheets

ARRAY SUBSTRATE

BACKGROUND OF THE INVENTION

1. Field of the Invention

The present invention relates to an array substrate, and more particularly, to an array substrate with asymmetric thin film transistor design and reduced pixel size.

2. Description of the Prior Art

The array substrate (also referred to as thin film transistor substrate) of a display panel includes a plurality of gate lines and data lines, wherein the pixel array are defined by the crossing structure of the gate lines and the data lines, and the pixel array includes a plurality of sub-pixels arranged in an array. As the market demand has changed, high resolution has become one of the most important requirements for display panels. For instance, smart phones with FHD resolution (1920*1080) display panels have been commercialized in the market recently. However, due to the limit of the manufacturing ability, the sizes of the sub-pixels are not able to be further reduced, which becomes the bottleneck for developing high resolution display panels.

SUMMARY OF THE INVENTION

It is therefore one of the objectives of the present invention to provide an array substrate with high resolution.

In an embodiment of the present invention, an array substrate is provided. The array substrate includes a substrate, a plurality of gate lines, a plurality of first data lines, a plurality of second data lines, a plurality of first thin film transistors and a plurality of second thin film transistors. The gate lines are disposed on the substrate and are substantially extended along a first direction. The first data lines and the second data lines are disposed on the substrate and are substantially extended along a second direction. The first data lines and the second data lines are arranged sequentially and alternately in the first direction, each of the first data lines has a plurality of first data line segments respectively disposed between two adjacent ones of the gate lines, and each of the second data lines has a plurality of second data line segments respectively disposed between the two adjacent ones of the gate lines. The first thin film transistors are disposed on the substrate. Each of the first thin film transistors includes a first gate electrode, a first source electrode and a first drain electrode, wherein the first gate electrode is connected to the corresponding gate line, and the first source electrode is connected between the corresponding two adjacent first data line segments and at least partially overlaps the corresponding first gate electrode. The second thin film transistors are disposed on the substrate. Each of the second thin film transistors includes a second gate electrode, a second source electrode and a second drain electrode, wherein the second gate electrode is connected to the corresponding gate line, and the second source electrode is connected between the corresponding two adjacent second data line segments and at least partially overlaps the corresponding second gate electrode. The first data line segment, the second data line segment and the next first data line segment arranged sequentially in the first direction define a first gap and a second gap, wherein the second gap is greater than the first gap. The first source electrode, the second source electrode and the next first source electrode arranged sequentially in the first direction are respectively corresponding to the first data line segment, the second data line segment and the next first data line segment to define a third gap and a fourth gap, wherein the third gap is greater than the first gap, and the fourth gap is smaller than the second gap.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
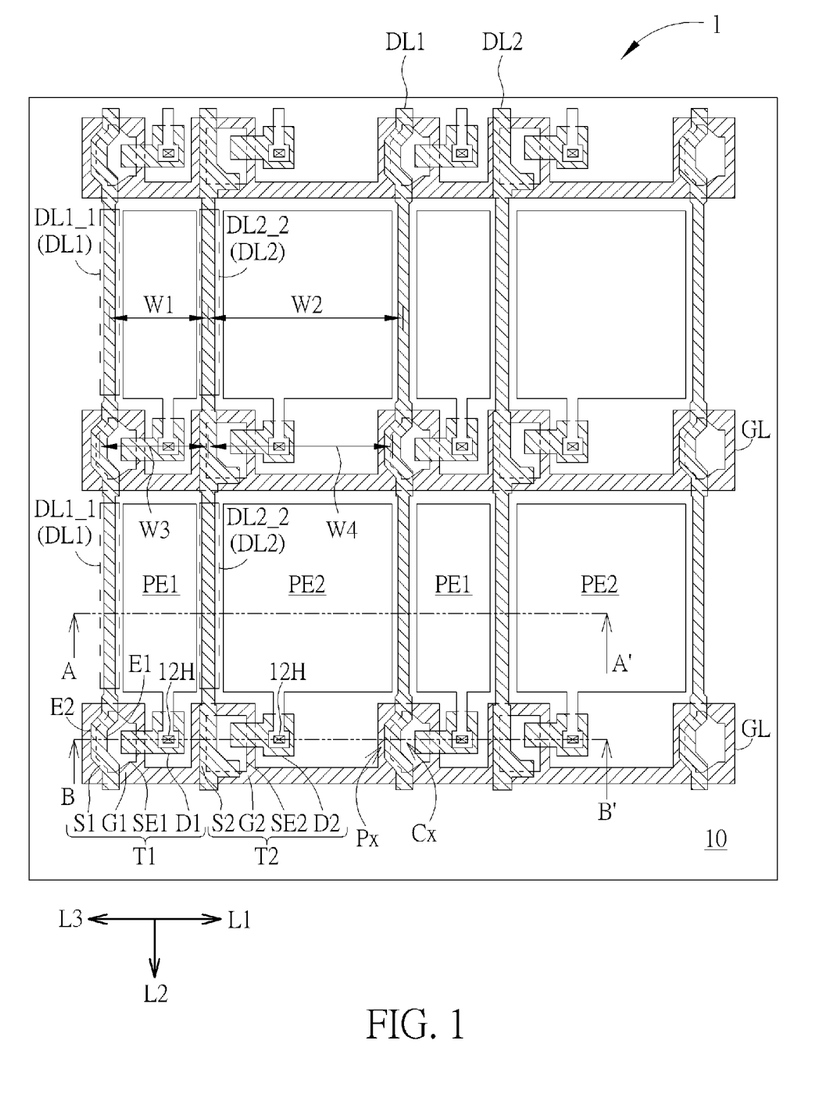
FIG. 1 is a top view schematically illustrating an array substrate according to a first embodiment of the present invention.
Figure 2:
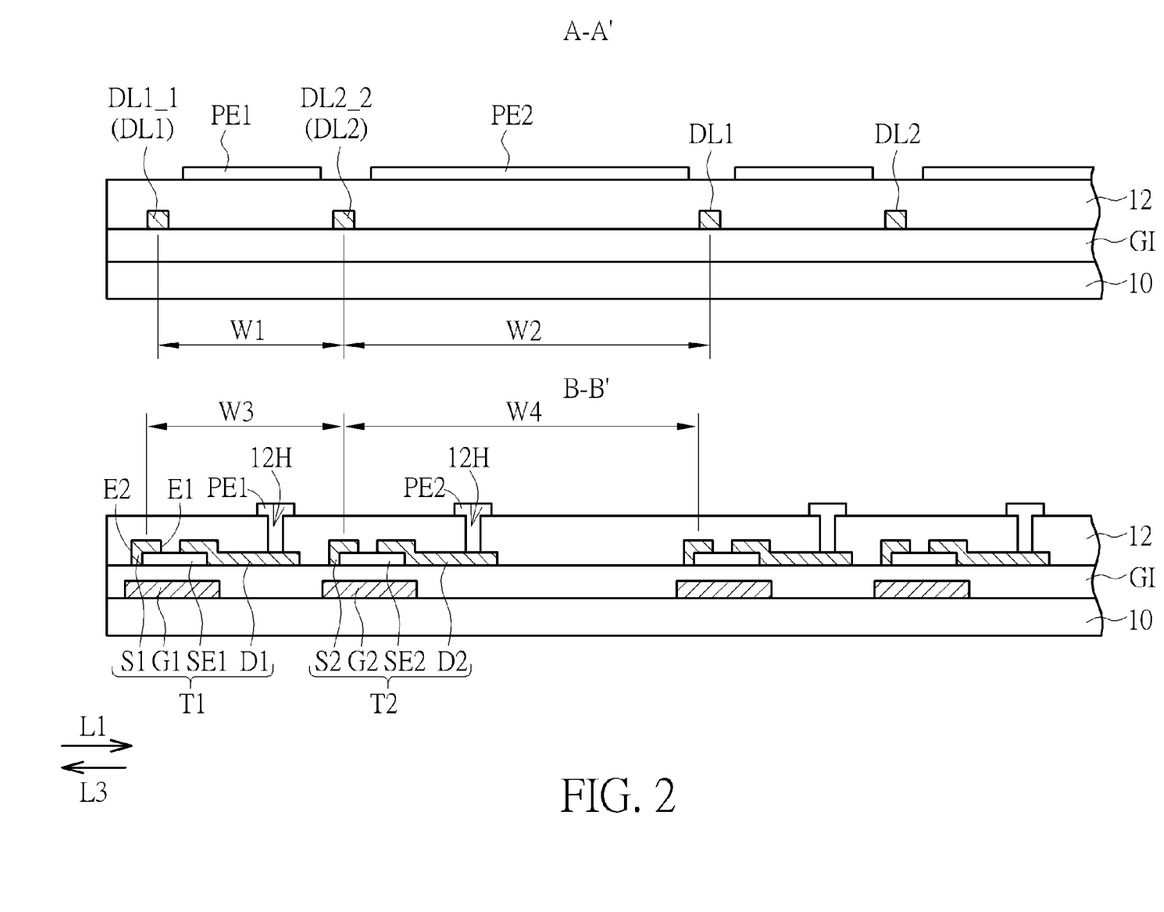
FIG. 2 is a cross-sectional view of the array substrate taken along line A-A' and line B-B' of FIG. 1.

Please refer to FIGS. 1-2. FIG. 1 is a top view schematically illustrating an array substrate according to a first embodiment of the present invention. FIG. 2 is a cross-sectional view of the array substrate taken along line A-A' and line B-B' of FIG. 1. As shown in FIGS. 1-2, the array substrate 1 of the present embodiment includes a substrate 10, a plurality of gate lines GL, a plurality of first data lines DL1, a plurality of second data lines DL2, a plurality of first thin film transistors T1 and a plurality of second thin film transistors T2. The substrate 10 may have light transmission properties, but not limited thereto. The substrate 10 may include a rigid substrate or a flexible substrate such as a glass substrate, a plastic substrate, a quartz substrate, a sapphire substrate or other suitable substrates. The gate lines GL are disposed on the substrate 10 and are substantially extended along a first direction L1. The first data lines DL1 and the second data lines DL2 are disposed on the substrate 10 and are substantially extended along a second direction L2. In the present embodiment, the first direction L1 and the second direction L2 are substantially perpendicular to each other, for instance, the first direction L1 may be the direction toward the right side of FIG. 1, the second direction L2 may be the direction toward the lower side of FIG. 1, but not limited thereto. The gate lines GL are substantially arranged to parallel the second direction L2. The spacing formed between two adjacent gate lines GL may be substantially the same, but not limited thereto. The first data lines DL1 and the second data lines DL2 are arranged sequentially and alternately in the first direction L1, in other words, in the first direction L1, the first data lines DL1 and the second data lines DL2 are arranged sequentially and repeatedly from left to right. In addition, each of the first data lines DL1 has a plurality of first data line segments DL1_1 respectively disposed between two adjacent gate lines GL, and each of the second data lines DL2 has a plurality of second data line segments DL2_2 respectively disposed between the two adjacent gate lines GL.

The first thin film transistors T1 are disposed on the substrate 10. Each of the first thin film transistors T1 includes a first gate electrode G1, a first semiconductor channel layer SE1, a first source electrode S1 and a first drain electrode D1, wherein the first gate electrode G1 is connected to the corresponding gate line GL, and the first semiconductor channel layer SE1 is disposed on the first gate electrode G1 and is insulated from the first gate electrode G1 by a gate insulating layer GI (not shown in FIG. 1). The first source electrode S1 and the first drain electrode D1 are disposed on the gate insulating layer GI and are located at two opposite sides of the first semiconductor channel layer SE1, and a part of the first source electrode S1 and a part of the first drain electrode D1 may respectively cover the upper surface of the first semiconductor channel layer SE1 and are in contact with and electrically connected to the first semiconductor channel layer SE1. The first source electrode S1 is connected between the corresponding two adjacent first data line segments DL1_1 and may at least partially overlap the corresponding first gate electrode G1. The second thin film transistors T2 are disposed on the substrate 10. Each of the second thin film transistors T2 includes a second gate electrode G2, a second semiconductor channel layer SE2, a second source electrode S2 and a second drain electrode D2, wherein the second gate electrode G2 is connected to the corresponding gate line GL, and the second semiconductor channel layer SE2 is disposed on the second gate electrode G2 and is insulated from the second gate electrode G2 by the gate insulating layer GI. The second source electrode S2 and the second drain electrode D2 are disposed on the gate insulating layer GI and are located at two opposite sides of the second semiconductor channel layer SE2, and a part of the second source electrode S2 and a part of the second drain electrode D2 may respectively cover the upper surface of the second semiconductor channel layer SE2 and are in contact with and electrically connected to the second semiconductor channel layer SE2. The second source electrode S2 is connected between the corresponding two adjacent second data line segments DL2_2 and may at least partially overlap the corresponding second gate electrode G2. In other words, in the first direction L1, the first thin film transistors T1 and the second thin film transistors T2 are arranged sequentially and repeatedly from left to right. In the second direction L2, the thin film transistors in the same column are either the first thin film transistors T1 or the second thin film transistors T2. For instance, all the thin film transistors in the odd columns are the first thin film transistors T1 and all the thin film transistors in the even columns are the second thin film transistors T2, but not limited thereto.

In the present embodiment, the first thin film transistors T1 and the second thin film transistors T2 are bottom gate type thin film transistors, but not limited thereto. The first thin film transistors T1 and the second thin film transistors T2 may also be top gate type thin film transistors or other types of thin film transistors. The gate line GL, the first gate electrode G1 and the second gate electrode G2 may be made of the same patterned conductive layer such as a first metal layer (Metal 1, M1), but not limited thereto. The material of the gate insulating layer GI may be inorganic insulating materials and/or organic insulating materials. The first semiconductor channel layer SE1 and the second semiconductor channel layer SE2 may be made of the same patterned semiconductor layer, but not limited thereto, and the material of the first semiconductor channel layer SE1 and the second semiconductor channel layer SE2 may be various kinds of semiconductor materials such as silicon (including amorphous silicon, polysilicon, monocrystalline silicon, microcrystalline silicon or nanocrystalline silicon), oxide semiconductors such as indium gallium zinc oxide (IGZO), indium gallium oxide (IGO) or other suitable materials. The first data line DL1, the second data line DL2, the first source electrode S1, the first drain electrode D1, the second source electrode S2 and the second drain electrode D2 may be made of the same patterned conductive layer such as a second metal layer (Metal 2, M2), but not limited thereto.

In the present embodiment, the first data line segment DL1_1, the second data line segment DL2_2 and the next first data line segment DL1_1 arranged sequentially in the first direction L1 sequentially define a first gap W1 and a second gap W2, wherein the second gap W2 is greater than the first gap W1. For instance, the first gap W1 is the distance between the first data line segment DL1_1 at the left side and the second data line segment DL2_2 at its right side, and the second gap W2 is the distance between the second data line segment DL2_2 mentioned above and the next first data line segment DL1_1 at the right side of the mentioned second data line segment DL2_2. Considering the line width of the first data line segment DL1_1 and the line width of the second data line segment DL2_2, the first gap W1 or the second gap W2 refers to the distance between a first point of the first data line segment DL1_1 and a second point of the second data line segment DL2_2, where the relative position between the first point and the first data line segment DL1_1 is identical to that between the second point and the second data segment DL2_2. For example, the first gap W1 refers to the spacing between the centerline of the first data line segment DL1_1 and the centerline of the second data line segment DL2_2. The second gap W2 refers to the spacing between the centerline of the second data line segment DL2_2 and the centerline of the first data line segment DL1_1, but not limited thereto.

Furthermore, the first source electrode S1, the second source electrode S2 and the next first source electrode S1 arranged sequentially in the first direction L1 respectively corresponding to the first data line segment DL1_1, the second data line segment DL2_2 and the next first data line segment DL1_1 sequentially define a third gap W3 and a fourth gap W4. In other words, the third gap W3 is the distance between the first source electrode S1 connected to the first data line segment DL1_1 at the left side and the second source electrode S2 connected to the second data line segment DL2_2 at the right side of the mentioned first data line segment DL1_1, and the fourth gap W4 is the distance between the second source electrode S2 connected to the second data line segment DL2_2 mentioned above and the next first data line segment DL1_1 at the right side of the mentioned second data line segment DL2_2. The third gap W3 is greater than the first gap W1, the fourth gap W4 is smaller than the second gap W2, and the fourth gap W4 is greater than the third gap W3. In addition, when observing along the second direction L2, the third gap W3 completely overlaps the first gap W1 and partially overlaps the second gap W2 of the adjacent left side sub-pixel. In addition, the second gap W2 completely overlaps the fourth gap W4 and partially overlaps the third gap W3 of the adjacent right side sub-pixel. In the present embodiment, the sum of the first gap W1 and the second gap W2 substantially equals the sum of the third gap W3 and the fourth gap W4, but not limited thereto. Considering the line width of the first source electrode S1 and the line width of the second source electrode S2, the third gap W3 or the fourth gap W4 refers to the distance between a first point of the first source electrode S1 and a second point of the second source electrode S2, where the relative position between the first point and the first source electrode S1 is identical to that between the second point and the second source electrode S2. For example, the third gap W3 refers to the spacing between the centerline of the first source electrode S1 and the centerline of the second source electrode S2, and the fourth gap W4 refers to the spacing between the centerline of the second source electrode S2 and the centerline of the first source electrode S1, but not limited thereto. In the present embodiment, the first source electrodes S1 and the second source electrodes S2 have different patterns. For example, each of the first source electrodes S1 may have a C-shaped pattern, which has a first edge E1 facing the corresponding first drain electrode D1 (for example, the first drain electrode D1 at its right side) and a second edge E2 away from the corresponding first drain electrode D1, wherein the first edge E1 is recessed in the third direction L3 opposite to the first direction L1 to form a recess part Cx, and the second edge E2 is protruded in the third direction L3 to form a protruding part Px. In other alternative embodiments, the first source electrode S1 may have other patterns offset in the third direction L3. Each of the second source electrodes S2 may have an L-shaped pattern, an I-shaped pattern or other suitable patterns, wherein the two edges of the second source electrode S2 and the two edges of the corresponding second data line segment DL2_2 may be substantially collinear in the second direction L2, but not limited thereto. In addition, the first drain electrode D1 and the second drain electrode D2 may have the same patterns or different patterns. More specifically, in the present embodiment, the centerline of the first source electrode S1 does not overlap/align the centerline of the corresponding first data line segment DL1_1 electrically connected to the first source electrode S1 in the second direction L2. The centerline of the second source electrode S2 overlaps/aligns the centerline of the second data line segment DL2_2 electrically connected to second source electrode S2 in the second direction L2 such that the fourth gap W4 is smaller than the second gap W2.

The array substrate 1 in the present embodiment may further include a plurality of first pixel electrodes PE1 and a plurality of second pixel electrodes PE2, wherein the first pixel electrodes PE1 are respectively electrically connected to the first drain electrodes D1 and the second pixel electrodes PE2 are respectively electrically connected to the second drain electrodes D2. The material of the first pixel electrode PE1 and the second pixel electrode PE2 may include transparent conductive materials such as indium tin oxide (ITO), indium zinc oxide (IZO) or other suitable transparent conductive materials, or opaque conductive materials such as metal, but not limited thereto. In addition, at least one dielectric layer 12 covers the first thin film transistors T1 and the second thin film transistors T2, the material of the dielectric layer 12 may be inorganic dielectric material and/or organic dielectric material. The dielectric layer 12 has a plurality of openings (contact holes) 12H respectively exposing the first drain electrodes D1 and the second drain electrodes D2. The first pixel electrodes PE1 are respectively electrically connected to the first drain electrodes D1 via the openings 12H and the second pixel electrodes PE2 are respectively electrically connected to the second drain electrodes D2 via the openings 12H.

Figure 3:
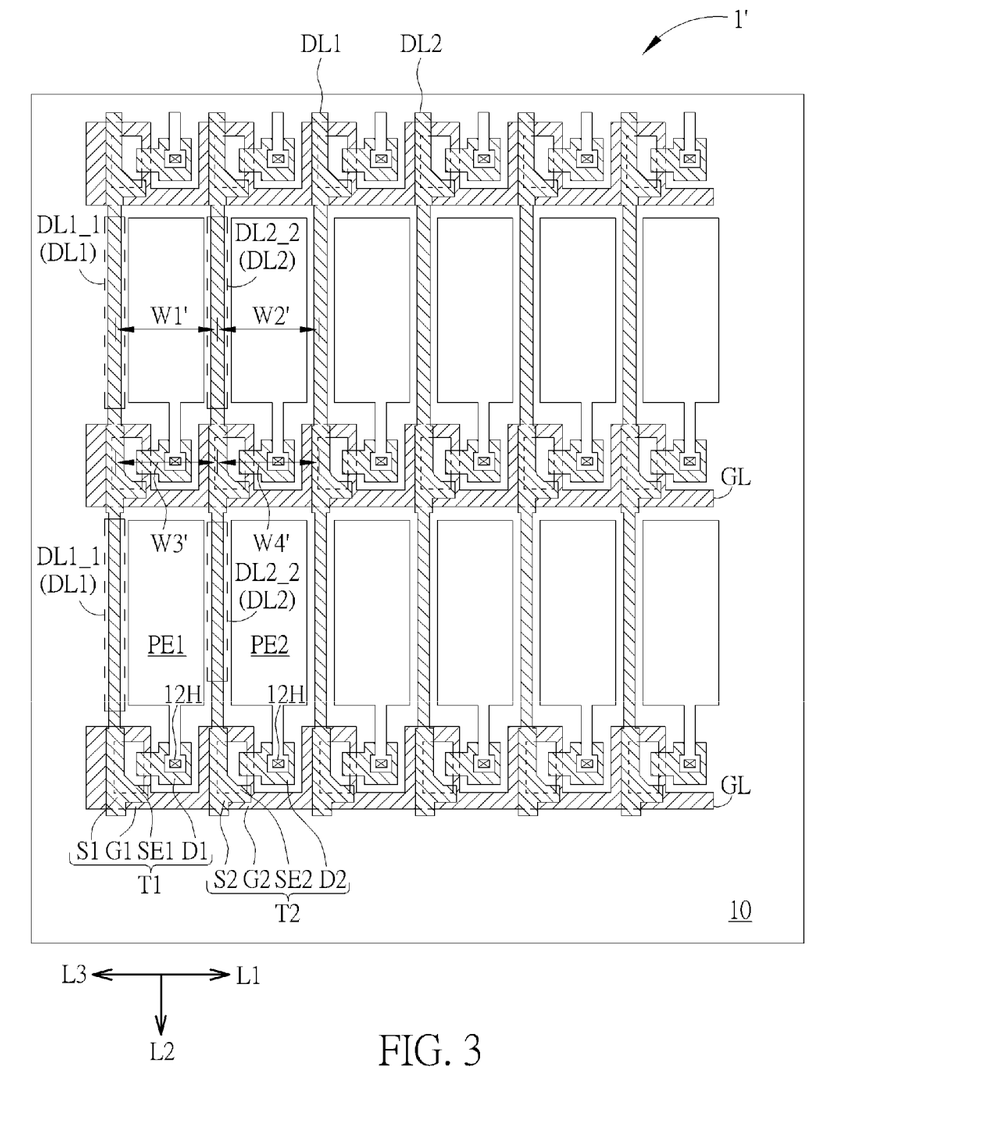
FIG. 3 is a top view schematically illustrating an array substrate according to a comparative embodiment of the present invention.

Please refer to FIG. 3. FIG. 3 is a top view schematically illustrating an array substrate according to a comparative embodiment of the present invention. As shown in FIG. 3, in the array substrate 1' of the comparative embodiment, the first data line segment DL1_1, the second data line segment DL2_2 and the next first data line segment DL1_1 arranged sequentially in the first direction L1 define a first gap W1' and a second gap W2', wherein the second gap W2' equals the first gap W1'. In other words, any two adjacent first data line segment DL1_1 and the second data line segment DL2_2 have the same spacing. In addition, the first thin film transistors T1 and the second thin film transistors T2 have the same patterns, more specifically, the first source electrode S1 and the second source electrode S2 have the same patterns, and the first drain electrode D1 and the second drain electrode have the same patterns. In other words, the first source electrode S1, the second source electrode S2 and the next first source electrode S1 arranged sequentially in the first direction L1 respectively corresponding to the first data line segment DL1_1, the second data line segment DL2_2 and the next first data line segment DL1_1 define a third gap W3' and a fourth gap W4', wherein the first gap W1', the second gap W2', the third gap W3' and the fourth gap W4' are all equal. Furthermore, the first gap W1' and the third gap W3' in the second direction L2 completely overlap each other and the second gap W2' and the fourth gap W4' in the second direction L2 completely overlap each other.

The array substrate 1' in the comparative embodiment has a symmetric thin film transistor design, in other words, the first thin film transistor T1 and the second thin film transistor T2 have the same design and the same size, and the first thin film transistor T1 and the corresponding first data line segment DL1_1 and the second thin film transistor T2 and the corresponding second data line segment DL2_2 have the same and consistent relative positions. The minimal width of the first thin film transistor T1 and the second thin film transistor T2 in the first direction L1 in the comparative embodiment is confined by the limitations of the manufacturing ability and the design rule. In other words, the minimal size of the third gap W3' and the minimal size of the third gap W4' is confined by the limitations of the manufacturing ability and the design rule, and the third gap W3' and the third gap W4' are not able to be further reduced. Since the first gap W1' and the third gap W3' in the second direction L2 completely overlap each other and the second gap W2' and the fourth gap W4' in the second direction L2 completely overlap each other, the first gap W1' and the second gap W2' are not able to be further reduced as well. Please refer to FIGS. 1-2 again. The array substrate 1 in the present embodiment employs the asymmetric thin film transistor design so as to offset the first source electrode S1 in the third direction L3. Though the third gap W3 in the present embodiment equals the third gap W3' in the comparative embodiment under the same manufacturing ability and the same design rule, the offset design of the first source electrode S1 would result in the third gap W3 partially overlapping a part of the second gap W2 of the adjacent sub-pixel in the third direction L3. As a result, the first gap W1 in the present embodiment (the width of the sub-pixel in the first direction L1) is smaller than the first gap W1' in the comparative embodiment, and the array substrate 1 in the present embodiment would have higher resolution.

Please refer to Table 1. Table 1 lists the width of sub-pixels (the width in the first direction L1) and resolution of the array substrate in the first embodiment and the comparative embodiment.

TABLE 1

|  | Comparative Embodiment | The First Embodiment |
|---|---|---|
| Width of sub-pixel | 21 micrometers | 19 micrometers |
| Resolution (PPI) | 403 | 445 |

As shown in Table 1, the asymmetric thin film transistor design in the present embodiment compared to the symmetric thin film transistor design in the comparative embodiment under the same manufacturing ability and the same design rule may further reduce the width of the sub-pixels (i.e. the first gap W1 in the present embodiment is smaller than the first gap W1' in the comparative embodiment) and the resolution is increased.

The array substrate in the present embodiment refers to the array substrate of the display panel such as the array substrate of the liquid crystal display (LCD) panel, but not limited thereto. For instance, the liquid crystal display panel may be a vertical electric field type LCD or a horizontal electric field type LCD. The vertical electric field type LCD such as vertical alignment (VA) LCD may include the array substrate of the present invention, a counter substrate and a liquid crystal layer disposed between the array substrate and the counter substrate. A common electrode disposed on the counter substrate forms a vertical electric field with the pixel electrode on the array substrate to drive the liquid crystal molecules. The horizontal electric field type LCD such as in-plane switching (IPS) LCD or fringe field switching (FFS) LCD may include a common electrode disposed on the array substrate of the present invention which forms a horizontal electric field with the pixel electrode on the array substrate to drive the liquid crystal molecules. The array substrate of the present invention may be applied to any active-matrix display panels which include any suitable non-self-luminous display panels or self-luminous display panels. The non-self-luminous display panels may include electro-phoretic display panels, electrowetting display panels or other suitable display panels. The self-luminous display panels may include organic electroluminescence display panels, inorganic electroluminescence display panels, plasma display panels, field emission display panels or other suitable display panels.

The array substrate is not limited by the aforementioned embodiment, and may have other different preferred embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 4:
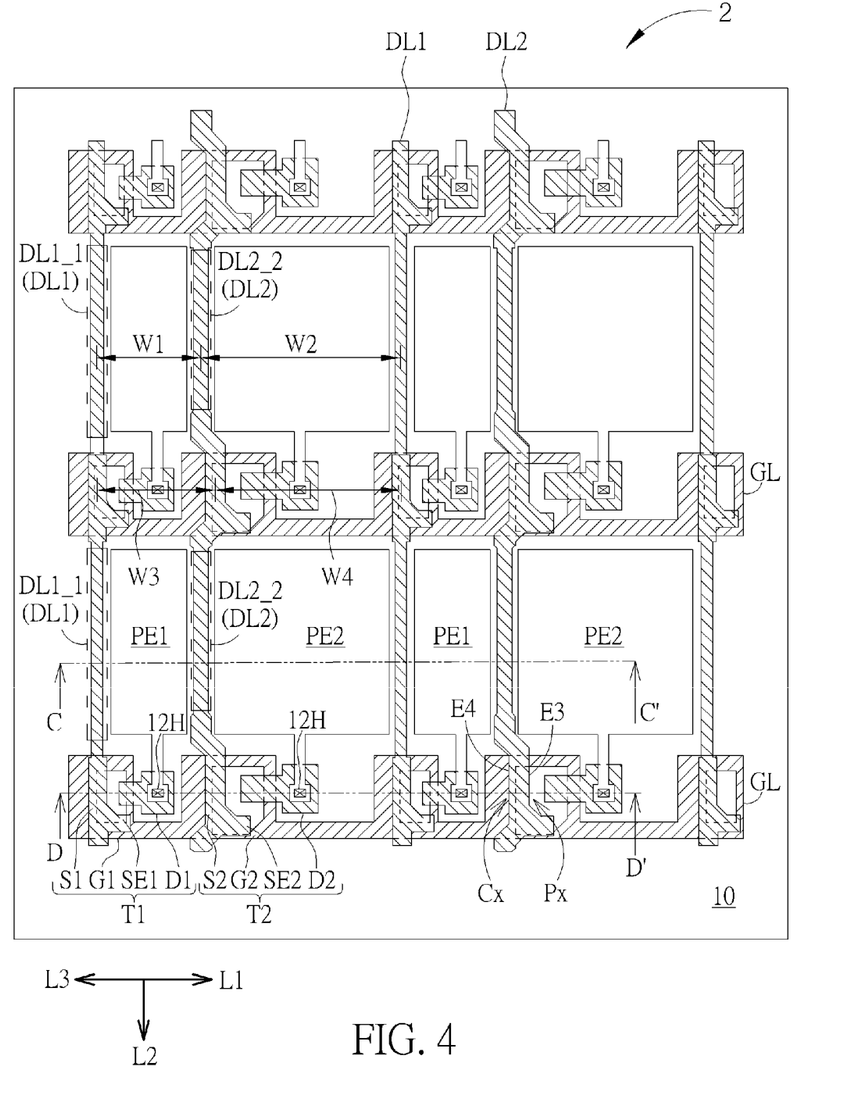
FIG. 4 is a top view schematically illustrating an array substrate according to a second embodiment of the present invention.
Figure 5:
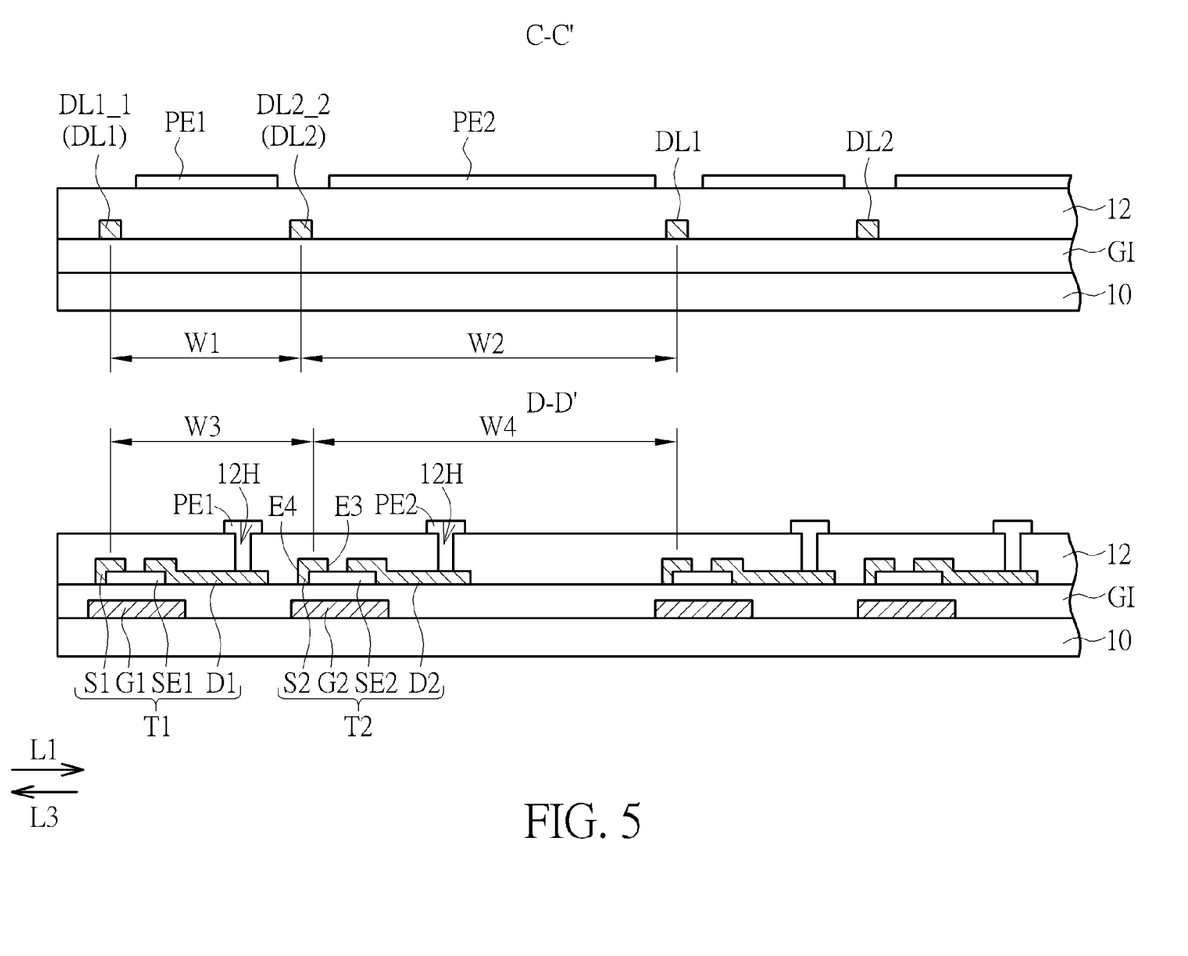
FIG. 5 is a cross-sectional view of the array substrate taken along line C-C' and line D-D' of FIG. 4.

Please refer to FIGS. 4-5. FIG. 4 is a top view schematically illustrating an array substrate according to a second embodiment of the present invention. FIG. 5 is a cross-sectional view of the array substrate taken along line C-C' and line D-D' of FIG. 4. As shown in FIGS. 4-5, the array substrate 2 in the present embodiment also has asymmetric thin film transistor design. The difference between the present embodiment and the first embodiment is that, in the array substrate 2 of the present embodiment, each of the second source electrodes S2 has a third edge E3 facing the corresponding second drain electrode D2 (such as the second drain electrode D2 at the right side) and a fourth edge E4 away from the corresponding second drain electrode D2, wherein the third edge E3 is protruded in the first direction L1 to form a protruding part Px, and the fourth edge E4 is recessed in the first direction L1 to form a recess part Cx. In the present embodiment, the third gap W3 is greater than the first gap W1, the fourth gap W4 is smaller than the second gap W2, and the sum of the first gap W1 and the second gap W2 substantially equals the sum of the third gap W3 and the fourth gap W4, but not limited thereto. More specifically, in the present embodiment, the centerline of the first source electrode S1 overlaps/aligns the centerline of the corresponding first data line segment DL1_1 electrically connected to the first source electrode S1 in the second direction L2. The centerline of the second source electrode S2 does not overlap/align the centerline of the second data line segment DL2_2 electrically connected to second source electrode S2 in the second direction L2 such that the fourth gap W4 is smaller than the second gap W2.

In the present embodiment, the second source electrode S2 offsets toward the first direction L1. Under the same manufacturing ability and the same design rule, the third gap W3 partially overlaps a part of the second gap W2 of the adjacent sub-pixel in the first direction L1. As a result, the first gap W1 (the sub-pixel width in the first direction L1) may be further reduced and the resolution of the array substrate 2 in the present embodiment is effectively increased.

Please refer to Table 2. Table 2 lists the width of sub-pixels (the width in the first direction L1) and resolution of the array substrate in the second embodiment and the comparative embodiment.

TABLE 2

|  | Comparative Embodiment | The Second Embodiment |
| --- | --- | --- |
| Width of sub-pixel | 21 micrometers | 18.5 micrometers |
| Resolution (PPI) | 403 | 461 |

As shown in Table 2, the asymmetric thin film transistor design in the second embodiment comparing to the symmetric thin film transistor design in the comparative embodiment under the same manufacturing ability and the same design rule may further reduce the width of the sub-pixels (in other words, the first gap W1 in the present embodiment is smaller than the first gap W1' in the comparative embodiment) and the resolution is increased.

Figure 6:
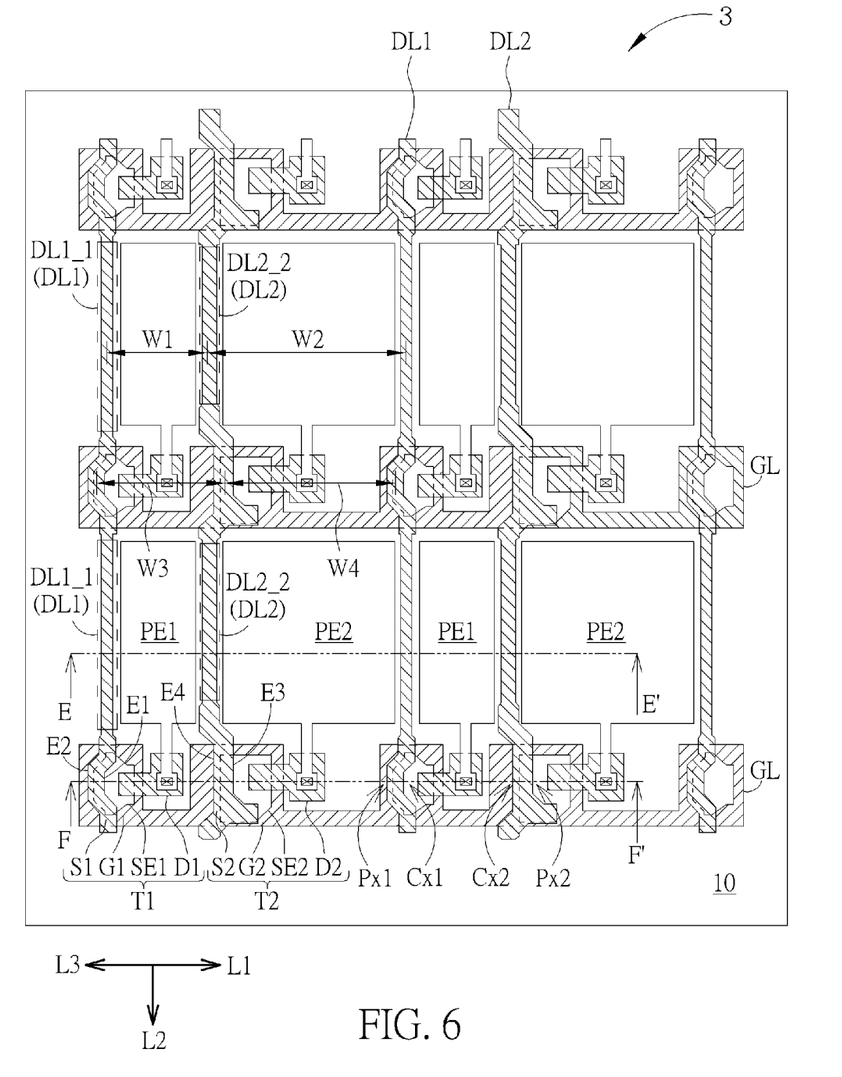
FIG. 6 is a top view schematically illustrating an array substrate according to a third embodiment of the present invention.
Figure 7:
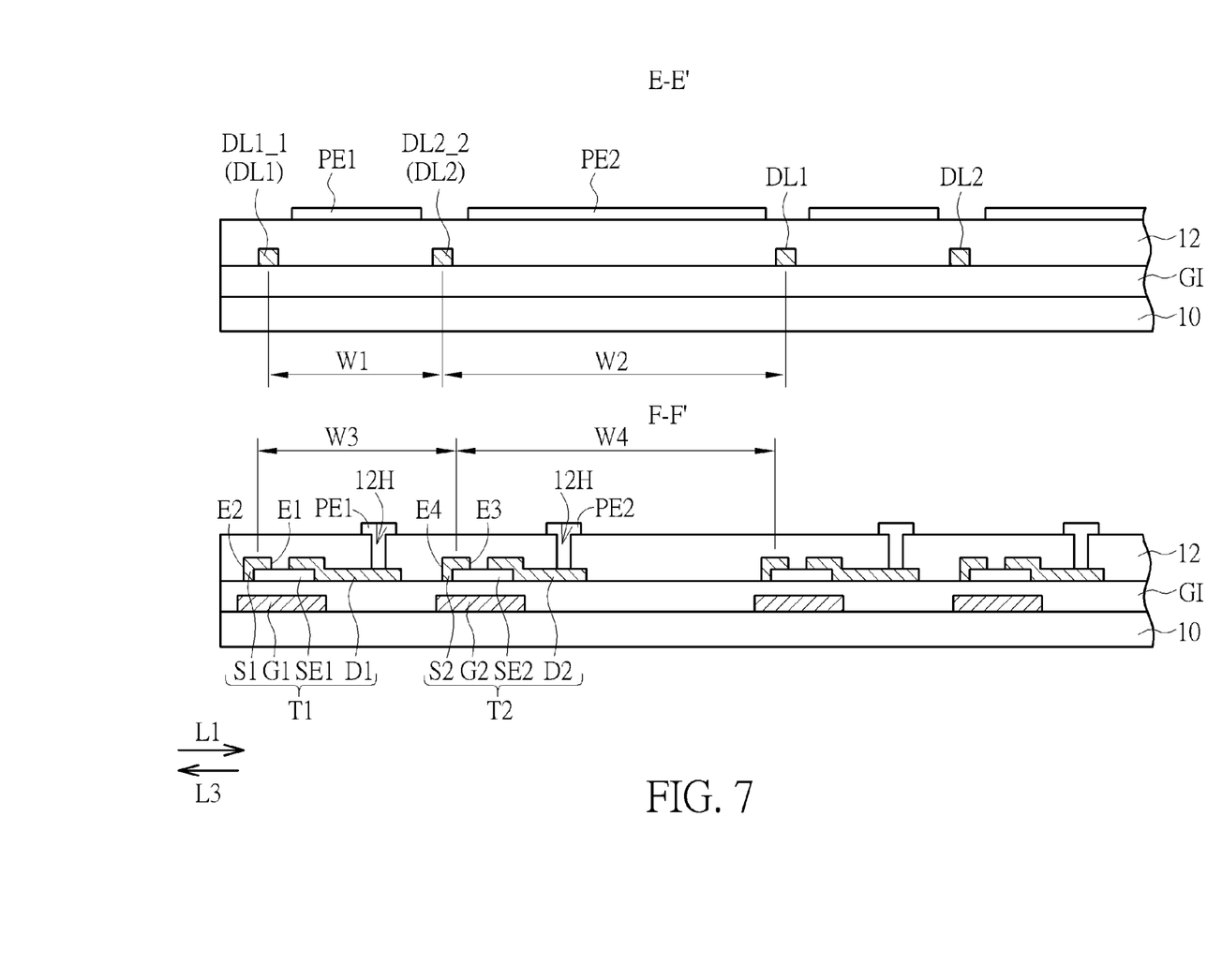
FIG. 7 is a cross-sectional view of the array substrate taken along line E-E' and line F-F' of FIG. 6.

Please refer to FIGS. 6-7. FIG. 6 is a top view schematically illustrating an array substrate according to a third embodiment of the present invention. FIG. 7 is a cross-sectional view of the array substrate taken along line E-E' and line F-F' of FIG. 6. As shown in FIGS. 6-7, the array substrate 3 in the present embodiment also has asymmetric thin film transistor design. The difference between the present embodiment and the first embodiment and the second embodiment is that, in the array substrate 3 of the present embodiment, each of the first source electrodes S1 has a first edge E1 facing the corresponding first drain electrode D1 and a second edge E2 away from the corresponding first drain electrode D1, the first edge E1 is recessed in the third direction L3 opposite to the first direction L1 to form a first recess part Cx1, and the second edge E2 is protruded in the third direction L3 to form a first protruding part Px1. Each of the second source electrodes S2 has a third edge E3 facing the corresponding second drain electrode D2 and a fourth edge E4 away from the corresponding second drain electrode D2, the third edge E3 is protruded in the first direction L1 to form a second protruding part Px2, and the fourth edge E4 is recessed in the first direction L1 to form a second recess part Cx2. In the present embodiment, the third gap W3 is greater than the first gap W1, the fourth gap W4 is smaller than the second gap W2, and the sum of the first gap W1 and the second gap W2 substantially equals the sum of the third gap W3 and the fourth gap W4, but not limited thereto. More specifically, in the present embodiment, the centerline of the first source electrode S1 does not overlap/align the centerline of the corresponding first data line segment DL1_1 electrically connected to the first source electrode S1 in the second direction L2. The centerline of the second source electrode S2 also does not overlap/align the centerline of the second data line segment DL2_2 electrically connected to second source electrode S2 in the second direction L2 such that the fourth gap W4 is smaller than the second gap W2.

In the present embodiment, the first source electrode S1 offsets toward the third direction L3 and the second source electrode S2 offsets toward the first direction L1. Under the same manufacturing ability and the same design rule, when observing along the second direction L2, the third gap W3 completely overlaps the first gap W1, and partially overlaps the second gaps W2 of the adjacent right side and left side sub-pixels. As a result, the first gap W1 (the sub-pixel width in the first direction L1) may be further reduced and the resolution of the array substrate 3 in the present embodiment is effectively increased.

Please refer to Table 3. Table 3 lists the width of sub-pixels (the width in the first direction L1) and resolution of the array substrate in the third embodiment and the comparative embodiment.

TABLE 3

|  | Comparative Embodiment | The Third Embodiment |
| --- | --- | --- |
| Width of sub-pixel | 21 micrometers | 16.5 micrometers |
| Resolution (PPI) | 403 | 512 |

As shown in Table 3, the asymmetric thin film transistor design in the third embodiment comparing to the symmetric thin film transistor design in the comparative embodiment under the same manufacturing ability and the same design rule may further reduce the width of the sub-pixels (i.e. the first gap W1 in the present embodiment is smaller than the first gap W1' in the comparative embodiment) and the resolution is increased.

In summary, the asymmetric thin film transistor design in the array substrate of the present invention offset the first source electrode and/or the second source electrode to effectively reduce the width of the sub-pixels and increase the resolution of the array substrate.

In addition, sub-pixel rendering (SPR) technique may cooperate with any embodiments of the present invention such that the resolution would not be decreased. More specifically, SPR technique is employed to display panels having pixels with wider width (i.e. the resolution of which is practically lower), in other words, the display panels may be made by less advanced processes. By the algorithm of SPR technique, the display panel is able to provide images with unnoticeable resolution differences to human visual system. As the SPR technique cooperates with any embodiments of the present invention, the smaller sub-pixels (such as the sub-pixels corresponding to the first pixel electrodes PE1) suffering the limitations of manufacturing ability may maintain the aperture ratio of the light transmission region via the design of the present invention. The disposition region of the first thin film transistor T1 and the second thin film transistor T2 is increased by offsetting the first source electrode S1 and/or the second source electrode S2. By applying the present invention, more sub-pixels are able to be fabricated on a display panel (in other words, the resolution is practically increased) under the same manufacturing ability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An array substrate, comprising:
a substrate;
a plurality of gate lines disposed on the substrate and substantially extended along a first direction;
a plurality of first data lines and a plurality of second data lines disposed on the substrate and substantially extended along a second direction, wherein the first data lines and the second data lines are arranged sequentially and alternately in the first direction, each of the first data lines has a plurality of first data line segments respectively disposed between two adjacent ones of the gate lines, and each of the second data lines has a plurality of second data line segments respectively disposed between the two adjacent ones of the gate lines;
a plurality of first thin film transistors, disposed on the substrate, wherein each of the first thin film transistors comprises:
a first gate electrode connected to the corresponding gate line;
a first source electrode connected between the corresponding two adjacent first data line segments and at least partially overlapping the corresponding first gate electrode; and
a first drain electrode; and
a plurality of second thin film transistors disposed on the substrate, wherein each of the second thin film transistors comprises:
a second gate electrode connected to the corresponding gate line;
a second source electrode connected between the corresponding two adjacent second data line segments and at least partially overlapping the corresponding second gate electrode; and
a second drain electrode;
wherein:
the first data line segment, the second data line segment and the next first data line segment arranged sequentially in the first direction define a first gap and a second gap;
the second gap is greater than the first gap;
the first source electrode, the second source electrode and the next first source electrode arranged sequentially in the first direction are respectively corresponding to the first data line segment, the second data line segment and the next first data line segment to define a third gap and a fourth gap;
the third gap is greater than the first gap; and
the fourth gap is smaller than the second gap.

2. The array substrate of claim 1, wherein the first source electrodes and the second source electrodes have different patterns.

3. The array substrate of claim 1, wherein each of the first source electrodes has a first edge facing the corresponding first drain electrode and a second edge away from the corresponding first drain electrode, the first edge is recessed in a third direction opposite to the first direction to form a recess part, and the second edge is protruded in the third direction to form a protruding part.

4. The array substrate of claim 1, wherein each of the second source electrodes has a third edge facing the corresponding second drain electrode and a fourth edge away from the corresponding second drain electrode, the third edge is protruded in the first direction to form a protruding part, and the fourth edge is recessed in the first direction to form a recess part.

5. The array substrate of claim 1, wherein each of the first source electrodes has a first edge facing the corresponding first drain electrode and a second edge away from the corresponding first drain electrode, the first edge is recessed in a third direction opposite to the first direction to form a first recess part, the second edge is protruded in the third direction to form a first protruding part, each of the second source electrodes has a third edge facing the corresponding second drain electrode and a fourth edge away from the corresponding second drain electrode, the third edge is protruded in the first direction to form a second protruding part, and the fourth edge is recessed in the first direction to form a second recess part.

6. The array substrate of claim 1, further comprising:
   a plurality of first pixel electrodes electrically connected to the first drain electrodes respectively; and
   a plurality of second pixel electrodes electrically connected to the second drain electrodes respectively.

7. The array substrate of claim 1, wherein a sum of the first gap and the second gap substantially equals a sum of the third gap and the fourth gap.

\* \* \* \* \*